US012686921B2

(12) United States Patent
McKeown et al.

(10) Patent No.: US 12,686,921 B2
(45) Date of Patent: Jul. 21, 2026

(54) FLUORINATION OF ANCILLARY LIGANDS OF GROUP (III) PRECURSORS AND THEIR APPLICATIONS IN VAPOR DEPOSITIONS

(71) Applicant: L'Air Liquide, Societe Anonyme pour l'Etude et l'Exploitation des Procedes Georges Claude, Paris (FR)

(72) Inventors: Bradley McKeown, Newark, DE (US); Kayla Diemoz, Newark, DE (US)

(73) Assignee: American Air Liquide, Inc., Newark, DE (US)

( * ) Notice: Subject to any disclaimer, the term of this patent is extended or adjusted under 35 U.S.C. 154(b) by 19 days.

(21) Appl. No.: 18/607,443

(22) Filed: Mar. 16, 2024

(65) Prior Publication Data

US 2025/0290202 A1 Sep. 18, 2025

(51) Int. Cl.
*C23C 16/455* (2006.01)

(52) U.S. Cl.
CPC .............................. *C23C 16/45553* (2013.01)

(58) Field of Classification Search
CPC ........ C23C 16/45553; C23C 16/45525; C23C 16/18; C23C 16/20
See application file for complete search history.

(56) References Cited

U.S. PATENT DOCUMENTS

| | | | |
|---|---|---|---|
| 2015/0140790 A1 | 5/2015 | Xiao et al. | |
| 2017/0186754 A1* | 6/2017 | Blomberg | H10B 69/00 |
| 2023/0304154 A1* | 9/2023 | Sakurai | C07C 215/08 |

FOREIGN PATENT DOCUMENTS

| | | |
|---|---|---|
| EP | 2 540 732 | 1/2013 |
| KR | 2006 0092680 | 8/2006 |
| KR | 10 0976877 | 8/2010 |
| KR | 2010 0112260 | 10/2010 |
| KR | 10 1082330 | 11/2011 |
| KR | 2016 0010992 | 1/2016 |

OTHER PUBLICATIONS

Eom, T. et al., Conformal formation of (GeTe2)1-x(Sb2Te3)x layers by atomic layer deposition for nanoscale phase change memories, Chem. Mat. 2012, 24, 2099-2110.

Eom, T. et al., Influence of the kinetic adsorption process on the atomic layer deposition process of (GeTe2)1-x(sb2Te3)x layers using Ge4+-alkoxide precursors, Chem. Mat., 2014, 26, 1583-1591.

Eom, T. et al., Combined ligande exchange and substitution reactions in atomic layer deposition of conformal Ge2Sb2Te5 film for phase change memory application, Chem. Mat., 2015, 27, 3707-3713.

Suh, S. et al, General synthesis ofhHomoleptic indium alkoxide complexes and the chemical vapor deposition of indium oxide films, J. Am. Chem. Soc., 2000, 122, 9396-9404.

Miinea, L. et al., Indium fluoroalkoxide compounds, Inorg. Chem. 1999, 38, 4447-4454.

Miinea, L. et al., Synthesis of aluminum and gallium fluoroalkoxide compounds and the low pressure metal-organic chemical vapor deposition of gallium oxide films, J. Mater. Chem., 1999, 9, 929-935.

Mears, K.L. et al., Structural and dynamic properties of gallium alkoxides, Inorganic Chemistry, 2019, 58, 10346-10356.

Pugh, D. et al, Gallium hydride complexes stabilized by multidentate alkoxide ligands: precursors to thin films of Ga2O3 at low temperatures, Chem. Eur. J., 2012, 18, 6079-6087.

Jung, E.A. et al., Indium complexes bearing donor-functionalized alkoxide ligands as precursors for indium oxide Thin films, J. Organomet. Chem. 2017, 833, 43-49.

Han, J.H. et al, Atomic layer deposition of indium oxide thin film from a liquid indium complex containing 1-dimethylamino-2-methyl-2-proposy lignands, Appl. Surf. Sci., 2016, 383, 1-8.

Daniele, S. et al., Molecular structure of [In2(M,n1-OR)(M,n2-OR)(n2-OR)3(n1-OR)] R = C2H4NMe2, a pincer ligand, Inorg. Chem. Commun. 2002, 5, 347-350.

Chi, Y. et al., Fluorinated aminoalkoxide CuII complexes: new CVD precursors for deposition of copper metal, J. Mater. Chem. 2002, 12, 3541-3550.

Chi, Y. et al., Synthesis and characterization of fluorinated aminoalkoxide and iminoalkoxide gallium complexes: application in chemical vapor deposition of Ga2O3 thin films, Organometallics, 2004, 23, 95-103.

Chou, T.-Y.et al., Fluorinated aminoalkoxide and ketoiminate indium complexes as MOCVD precursors for In2O3 thin film deposition, Inorg. Chem. 2003, 42, 6041-6049.

Basharat, S. et al., Aerosol assisted chemical vapor deposition of In2O3 films from Me3In and donor functionalized alcohols, Inorg. Chem. 2007, 46, 9473-9480.

Basharat, S. et al., Molecular precursors to gallium oxide thin films, Dalton Trans., 2004, 21, 3475-3480.

Parish, J.D. et al., Evaluation of Sn(II) aminoalkoxide precursors for ALD of SnO thin films, Dalton Trans. 2021, 50, 13902-13914.

* cited by examiner

*Primary Examiner* — Michael P Wieczorek
(74) *Attorney, Agent, or Firm* — Yan Jiang

(57) ABSTRACT

A method for forming a Group (III)-containing film on a substrate comprises exposing the substrate to a vapor of a Group (III)-containing film-forming composition that contains a Group (III)-containing precursor and depositing at least part of the Group (III)-containing precursor onto the substrate to form the Group (III)-containing film on the substrate through a vapor deposition process. The Group (III)-containing precursor contains at least one fluorocarbon group on at least one of ancillary ligands. The Group (III)-containing precursor is tris(2-(dimethylamino)methyl-1,1,1,3,3,3-hexafluoropropan-2-ol)indium, represented as $(F\text{-dmamp})_3In$.

7 Claims, 3 Drawing Sheets

FLUORINATION OF ANCILLARY LIGANDS OF GROUP (III) PRECURSORS AND THEIR APPLICATIONS IN VAPOR DEPOSITIONS

TECHNICAL FIELD

The present invention relates to fluorination of ancillary ligands of Group (III) precursors for enhanced volatility, thermal stability, and reactivity during vapor deposition of Group (III) containing thin films and nanostructured materials, in particular, to Group (III)-containing precursors having coordination sphere occupied by bis-chelating ligands with ether/alkoxide or amine/alkoxide moieties, in addition to monodentate alkoxide or amine ligands.

BACKGROUND

Group (III) containing alloys, thin films, and nanostructured materials are highly versatile optoelectronic materials and widely of interest for applications in semiconductor research and industry. However, existing precursors for manufacturing the Group (III) containing alloys, thin films, and nanostructured materials are deficient in many areas that preclude their use in high volume manufacturing, for example, incompatible thermal windows and poor conformality or growth rates. This has precipitated ever-increasing interest in syntheses of new Group (III) organometallic compounds, in particular compounds of gallium and indium, for their potential uses as precursors for enabling large scale production of III-V and III-VI compound semiconductors.

III-V compound semiconductors have emerged as potential replacements for poly-Si channel material. These materials have high carrier mobility and injection velocity. For example, InGaAs is believed to be one of the stronger contenders for the future replacement of silicon in CMOS systems. Despite impressive physical properties of indium alloys and, indeed, all III-V alloys, these materials are constrained by two key challenges. Syntheses of these materials are either limited to slow growth processes, such as molecular beam epitaxy, or by metalorganic chemical vapor deposition (CVD), which requires enormous amounts of materials and challenging engineering to achieve throughput, uniformity, and reproducibility. The next challenge relates specifically to the semiconductor industry. Combining III-V semiconductors with silicon is extremely challenging and has prevented the rapid development of high-performance devices. The development of new precursors for III-V alloys, in particular those based on indium, which are compatible with high-throughput production and ease of device integration is highly desirable to multiple industries.

The III-VI compound semiconductors, e.g., gallium oxide and indium oxide, have a range of applications from catalysis to optoelectronics to sensitive gas sensors. $In_2O_3$ films are conductive and transparent to visible light. Thus, $In_2O_3$ films are used as a transparent conducting oxide (TCO), particularly when doped with other elements, and are employed on a massive scale in many optoelectronic device applications. Gallium has also been used to dope zinc oxide, producing transparent conductive films as an alternative to indium tin oxide (ITO) thin films for optoelectronic and electronic devices such as flat panel displays, solar cells, and light-emitting diodes.

The compound semiconductors such as InGaAs are a valid candidate for an alternative channel material in 3D NAND flash memory due to the extremely high mobility. However, the challenging architecture of highly scaled 3D NAND asks for the growth of thin channel layers on the inner sidewall of the ONO stack in a so-called macaroni structure with extremely high aspect ratios. The only viable process that may offer acceptable layer thickness uniformity along the height of the cell stack is Atomic Layer Deposition (ALD). ALD of III-V materials has been shown in the past, based on alternating pulses of conventional MOCVD precursors such as $(CH_3)_3Ga$, $(CH_3)_3In$ and t-butyl arsine. These processes have been demonstrated by external partners to result in epitaxial growth of GaAs or InGaAs. However, this chemistry does not provide the needed self-termination, temperature range, and surface selectivity for an ALD process. Moreover, non-traditional Group (III) precursors, particularly of indium, do not possess the required reactivity or volatility for incorporation into a thermal ALD process for channel deposition in high aspect ratio 3D NAND architectures.

Examples of dealkoxysilylation chemistries that have been investigated for deposition processes are as follows.

US 2015140790 A1 discloses precursors for Germanium Antimony Telluride (GST) films in ALD/CVD Processes, in which details of GST film deposition via CVD or ALD using Germanium alkoxides, trisilylantimony precursors, and disilyltelluride precursors are described.

Eom et al., disclose (Conformal Formation of $(GeTe_2)_{1-x}(Sb_2Te_3)_x$ Layers by ALD for Nanoscale Phase Change Memories, *Chem. Mat.,* 2012, 24, 2099-2110) deposition of Ge—Sb—Te phase changing material layers using silyl-Te and alkoxy-Ge and alkoxy-Sb metal organic precursors.

Eom et al. disclose (Influence of the Kinetic Adsorption Process on the ALD Process of $(GeTe_2)_{1-x}(Sb_2Te_3)_x$ Layers using $Ge^{4+}$-Alkoxide Precursors, *Chem. Mat.,* 2014, 26, 1583-1591) deposition of Ge—Sb—Te phase changing material layers using silyl-Te and alkoxy-Ge and alkoxy-Sb metal organic precursors.

Eom et al. disclose (Combined Ligand Exchange and Substitution Reactions in ALD of Conformal $Ge_2Sb_2Te_5$ Film for Phase Change Memory Application, *Chem. Mat.,* 2015, 27, 3707-3713) deposition of Ge—Sb—Te phase changing material layers using silyl-Te and alkoxy-Ge and alkoxy-Sb metal organic precursors.

The following are related to Group (III) alkoxide complexes.

Suh et al. discloses (General Synthesis of Homoleptic Indium Alkoxide Complexes and the Chemical Vapor Deposition of Indium Oxide Films, *J. Am. Chem. Soc.,* 2000, 122, 9396-9404) details the synthesis of a series of homoleptic indium alkoxides. One complex, $[In(OMe_2Et)_3]_2$, was used for a low pressure CVD process to deposit $In_2O_3$ using oxygen.

Minea et al., discloses (Indium Fluoroalkoxide Compounds, *Inorg. Chem.* 1999, 38, 4447-4454) details the synthesis of indium fluoroalkoxides, highlights the increased volatility of fluorinated compounds relative to analogues ones in *J. Am. Chem. Soc.,* 2000, 122, 9396-9404.

Minea et al., disclose (Synthesis of aluminum and gallium fluoroalkoxide compounds and the low pressure metal-organic chemical vapor deposition of gallium oxide films, *J. Mater. Chem.,* 1999, 9, 929-935) synthesis of a series of aluminum and gallium fluoroalkoxide complexes with a chelating amine, gallium oxide films were reported using one of the novel precursors and air.

Mears et al., disclose (Structural and Dynamic Properties of Gallium alkoxides, *Inorganic Chemistry,* 2019, 58, 10346-10356) two derivatives of the complex, $Ga(OR)_2Cl$, were used as precursors for AACVD to deposit $Ga_2O_3$ at 450° C.

EP2540732 A1 discloses Deposition of Gallium Containing Thin Films using New Gallium Precursors, in which details syntheses of gallium compounds of the formula $[Ga(OR')R_2]_x$ and their use in $Ga_2O_3$ ALD are described.

Pugh et al., disclose (Gallium Hydride Complexes Stabilized by Multidentate Alkoxide Ligands: Precursors to Thin Films of Ga2O3 at Low Temperatures, *Chem. Eur. J.,* 2012, 18, 6079-6087) details a reliable synthesis of gallium hydride complexes stabilized by multidentate alkoxide ligands and deposition of $Ga_2O_3$ by AACVD.

Jung et al., disclose (Indium Complexes Bearing Donor-functionalized Alkoxide Ligands as Precursors for Indium Oxide Thin Films, *J. Orgaomet. Chem.* 2017, 833, 43-49) series of heteroleptic indium complexes with donor-functionalized alkoxide ligands. Molecules with oxygen vs. nitrogen for chelation resulted in greater thermal stability by TGA.

Examples of Group (III) complexes with amino alcohol ligands are as follows.

KR20160010992 discloses novel indium derivatives, its preparation method and the thin films using the same and claims a heteroleptic indium precursor with one chelating amino alcohol and other alkyl ligands. These structures are reported to be dimers.

KR101082330 discloses novel indium amino-alkoxide complexes and processes for preparing and claims heteroleptic indium precursor with at least one chelating amino alcohol ligand and other alkoxide ligands.

KR100976877 discloses novel indium amino-alkoxide complexes and process for preparing and claims heteroleptic indium precursor with at least one chelating amino alcohol ligand and other alkyl amine ligands.

KR20050013756 discloses volatile indium amino-alkoxide complexes and process for preparing and claims homoleptic indium complexes with chelating amino alcohol ligands.

Han et al., disclose (Atomic layer deposition of indium oxide thin film from a liquid indium complex containing 1-dimethylamino-2-methyl-2-propoxy ligands, *Appl. Surf. Sci.,* 2016, 383, 1-8) details the synthesis and use of a liquid homoleptic indium precursor with chelating amino alcohol ligands. The complex was used as a precursor for indium oxide ALD with $O_3$.

Daniele et al., disclose (Molecular structure of $[In_2(\mu,\eta^1—OR)(\mu,\eta^2—OR)(\eta^2—OR)_3(\eta^1—OR)]$ $R═C_2H_4NMe_2$, a pincer ligand, Inorg. Chem. Commun. 2002, 5, 347-350) synthesis of two homoleptic indium complexes with chelating alkoxide ligands. Both an oxygen and nitrogen used for chelation and were found to have bridging ligands.

Chou et al., disclose (Fluorinated Aminoalkoxide and Ketoiminate Indium Complexes as MOCVD Precursors for $In_2O_3$ Thin Film Deposition, *Inorg. Chem.* 2003, 42, 6041-6049) the synthesis of heteroleptic indium complexes with one fluorinated aminoalkoxide or ketoiminate ligand that chelates to the metal center. All structures were isolated as dimers. Two different complexes were used in $In_2O_3$ CVD processes.

Chi et al., disclose (Synthesis and Characterization of Fluorinated Aminoalkoxide and Iminoalkoxide Gallium Complexes: Application in Chemical Vapor Deposition of $Ga_2O_3$ Thin Films, Organometallics, 2004, 23, 95-103) the synthesis of four different heteroleptic gallium complexes using fluorinated aminoalcohol and iminoalcohol ligands, containing either methyl or chloride ligands. Molecules were evaluated as precursors for gallium oxide films.

Basharat et al., disclose (Aerosol Assisted Chemical Vapor Deposition of $In_2O_3$ Films from $Me_3In$ and Donor Functionalized Alcohols, *Inorg. Chem.* 2007, 46, 9473-9480) the reaction of $InMe_3$ and donor functionalized alcohols in toluene under aerosol assisted chemical vapor deposition conditions leads to indium oxide thin films on glass. The heteroleptic complexes were also synthesized and isolated independent from the AACVD in situ process.

Basharat et al., disclose (Molecular Precursors to Gallium Oxide Thin Films, *Dalton,* 2004, 21, 3475-3480) synthesis of heteroleptic and homoleptic, $[GaEt_2(OR)]_2$ and $Ga(OR)_3$, $R═OCH_xE$ $E═NMe_2$ or OMe, for LP-CVD of $Ga_2O_3$.

Here are examples of other metal complexes with fluorinated amino alcohols for deposition processes.

Parish et al., disclose (Evaluation of Sn(II) aminoalkoxide precursors for ALD of SnO thin films, *Dalton Trans.* 2021, 50, 13902-13914) synthesis of a serious of heteroleptic and homoleptic tin(II) complexes from a series of aminoalcohols and fluorinated amino alcohols, deposition studies to be reported separate.

Chi et al. disclose (Fluorinated aminoalkoxide CuII complexes: new CVD precursors for deposition of copper metal, J. Mater. Chem. 2002, 12, 3541-3550) series of new copper complexes synthesized with fluorinated amino alcohols and used for CVD of copper metal.

Thus, new Group (III) precursors are needed to enable the vapor phase deposition of quality III-V/III-VI films that are compatible with targeted chemistries and process limitations, e.g., temperature windows, required for next generation devices and applications.

SUMMARY

Disclosed is a method for forming a Group (III)-containing film on a substrate, the method comprising the steps of:

- exposing the substrate to a vapor of a Group (III)-containing film-forming composition that contains a Group (III)-containing precursor; and
- depositing at least part of the Group (III)-containing precursor onto the substrate to form the Group (III)-containing film on the substrate through a vapor deposition process, wherein the Group (III)-containing precursor is selected from the following formulae;

(a)

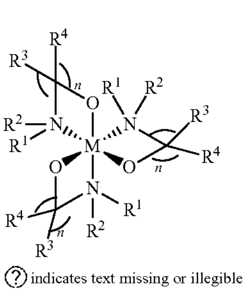

(?) indicates text missing or illegible when filed wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons;

(b)

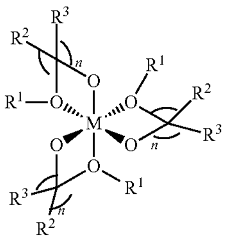

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^3$ is a fluorine or fluorocarbon; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons;

(c)

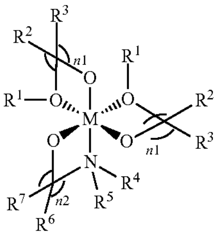

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(d)

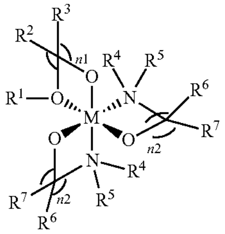

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons:

(e)

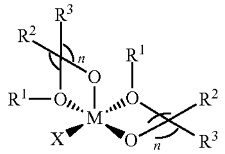

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X$=$$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; and at least one of $R_1$ though $R^6$ is a fluorine or fluorocarbon;

(f)

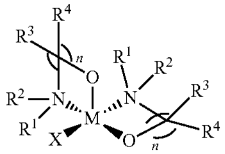

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(g)

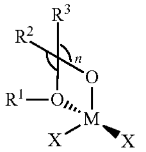

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forms 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; at least one of $R^1$ though $R^6$ is a fluorine or fluorocarbon;

(h)

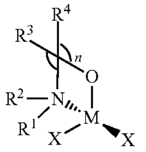

wherein M is Al, Ga, or In; $R^1$, $R^2$, $R^3$, and $R^4$ are independently selected from hydrogen, fluorine, linear, branched or cyclic alkyl groups, fluorocarbons, or aryl groups with between 1 and 12 carbons; wherein n=1-3 forms 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(i)

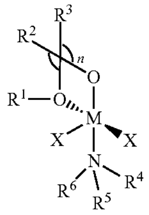

wherein M is Al, Ga, or In; $R^2$, $R^3$, $R^4$, $R^5$ and $R^6$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^7$ or $NR^8R^9$; $R^7$ is not hydrogen but independently selected from linear, branched or cyclic alkyl groups, fluorocarbons, or aryl groups with between 1 and 12 carbons; $R^8$ and $R^9$ are independently selected from hydrogen, fluorine, linear, branched or cyclic alkyl groups, fluorocarbons, or aryl groups with between 1 and 12 carbons; at least one of $R^1$ though $R^9$ is a fluorine or fluorocarbon;

(j)

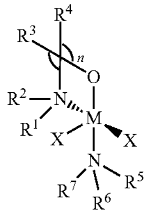

wherein M is Al, Ga, or In; $R^1$, $R^2$, $R^3$, $R^4$, $R^5$, $R^6$ and $R^7$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^8$ or $NR^9R^{10}$; $R^8$ is not hydrogen but independently selected from linear, branched or cyclic alkyl groups, fluorocarbons, or aryl groups with between 1 and 12 carbons; $R^9$ and $R^{10}$ are independently selected from hydrogen, fluorine, linear, branched or cyclic alkyl groups, fluorocarbons, or aryl groups with between 1 and 12 carbons; at least one of $R^1$ though $R^{10}$ is a fluorine or fluorocarbon. The disclosed deposition method may include one or more of the following features:

- the Group (III)-containing precursor containing at least one fluorocarbon group on at least one of ancillary ligands;
- the Group (III)-containing precursor being tris(2-(dimethylamino)methyl-1,1,1,3,3,3-hexafluoropropan-2-ol)indium, represented as $(F\text{-dmamp})_3In$;
- the Group (III)-containing precursor being tris(2-(ethylmethylamino)methyl-1,1,1,3,3,3-hexafluoropropan-2-ol)indium;
- the Group (III)-containing precursor being Tris(1,1,1,3,3,3-hexafluoro-2-(methoxymethyl)propan-2-ol)indium;
- the Group (III)-containing precursor being Tris(1,1,1,3,3,3-hexafluoro-2-(methoxymethyl)propan-2-ol)aluminum;
- the Group (III)-containing precursor being bis((2-((dimethylamino)methyl)-1,1,1,3,3,3-hexafluoropropan-2-ol)(ethoxy)aluminum;
- further comprising the step of exposing the substrate to a co-reactant;
- the co-reactant being $E(R_3M)_x$, where E is an element of group V or VI selected from P, As, Sb, S, Se, Te, and x=2 or 3, M is Si, Ge, or Sn and R is a alkyl group;
- the co-reactant being selected from $O_3$, $O_2$, $O_2$ plasma, $H_2O$, NO, $N_2O$, $NO_2$, $H_2O_2$, O radicals and combinations thereof;
- the co-reactant being selected from $NH_3$, NO, $N_2O$, hydrazines, $N_2$ plasma, $N_2/H_2$ plasma, $NH_3$ plasma, amines and combinations thereof;
- the Group (III)-containing film being InGaAs, $In_xO_y$ (x=0.5-1.5, y=0.5-1.5), InSnO (ITO), InGaZnO ($In_2Ga_2ZnO_7$) (IGZO), InN, InP, InAs, InSb, InSe, InTe, $In_2S_3$, $Ga_2O_3$, GaN, GaAs, $Al_2O_3$, AlN, AlP, AlAs, GaP, GaSb, or combinations thereof;
- the Group (III)-containing film being $In_xO_y$, where x=0.5-1.5, y=0.5-1.5, selected from $In_2O_3$, $In_2O$, or In(I) oxide;
- the Group (III)-containing film being $In_2O_3$; and
- the vapor deposition process being a thermal ALD process.

Disclosed is also a composition for deposition of a film comprising a Group (III)-containing precursor, the Group (III)-containing precursor being of the formulae:

(a)

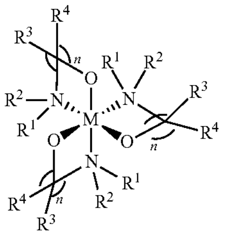

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons;

(b)

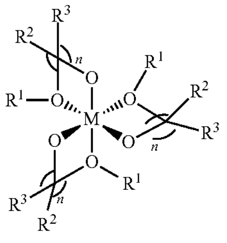

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^3$ is a fluorine or fluorocarbon; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons;

(c)

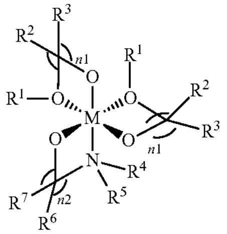

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(d)

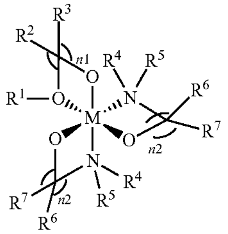

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(e)

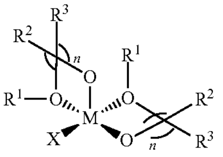

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; and at least one of $R^1$ though $R^6$ is a fluorine or fluorocarbon;

(f)

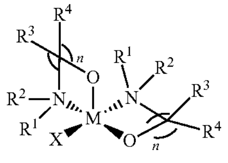

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(g)

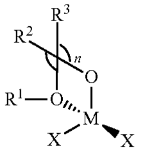

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forms 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; at least one of $R^1$ though $R^6$ is a fluorine or fluorocarbon;

(h)

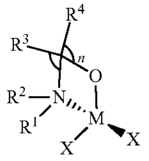

wherein M is Al, Ga, or In; $R^1$, $R^2$, $R^3$, and $R^4$ are independently selected from hydrogen, fluorine, linear, branched or cyclic alkyl groups, fluorocarbons, or aryl groups with between 1 and 12 carbons; wherein n=1-3 forms 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(i)

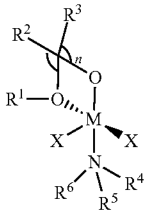

wherein M is Al, Ga, or In; $R^2$, $R^3$, $R^4$, $R^5$ and $R^6$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^7$ or $NR^8R^9$; $R^7$ is not hydrogen but independently selected from linear, branched or cyclic alkyl groups, fluorocarbons, or aryl groups with between 1 and 12 carbons; $R^8$ and $R^9$ are independently selected from hydrogen, fluorine, linear, branched or cyclic alkyl groups, fluorocarbons, or aryl groups with between 1 and 12 carbons; at least one of $R^1$ though $R^9$ is a fluorine or fluorocarbon;

(j)

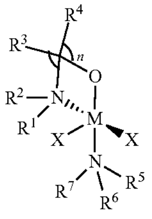

wherein M is Al, Ga, or In; $R^1$, $R^2$, $R^3$, $R^4$, $R^5$, $R^8$ and $R^7$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^8$ or $NR^9R^{10}$; $R^8$ is not hydrogen but independently selected from linear, branched or cyclic alkyl groups, fluorocarbons, or aryl groups with between 1 and 12 carbons; $R^9$ and $R^{10}$ are independently selected from hydrogen, fluorine, linear, branched or cyclic alkyl groups, fluorocarbons, or aryl groups with between 1 and 12 carbons; at least one of $R^1$ though $R^{10}$ is a fluorine or fluorocarbon. The disclosed composition may include one or more of the following features:

- the Group (III)-containing precursor containing at least one fluorocarbon group on at least one of the ancillary ligands;
- the Group (III)-containing precursor being tris(2-(dimethylamino)methyl-1,1,1,3,3,3-hexafluoropropan-2-ol)indium, represented as $(F\text{-dmamp})_3In$;
- the Group (III)-containing precursor being tris(2-(ethylmethylamino)methyl-1,1,1,3,3,3-hexafluoropropan-2-ol)indium;
- the Group (III)-containing precursor being Tris(1,1,1,3,3,3-hexafluoro-2-(methoxymethyl)propan-2-ol)indium;
- the Group (III)-containing precursor being Tris(1,1,1,3,3,3-hexafluoro-2-(methoxymethyl)propan-2-ol)aluminum; and
- the Group (III)-containing precursor being bis((2-((dimethylamino)methyl)-1,1,1,3,3,3-hexafluoropropan-2-ol)(ethoxy)aluminum.

Disclosed is also a method for forming a Group (III)-containing film on a substrate, the method comprising the steps of:

- forming a chemisorbed and/or physisorbed film, on the surface of the substrate, of an Group (III)-containing precursor having the formula:

(a)

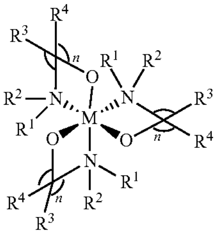

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons;

(b)

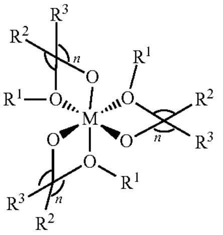

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^3$ is a fluorine or fluorocarbon; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons;

(c)

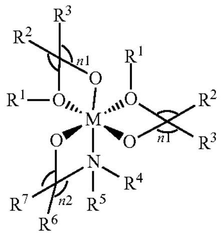

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(d)

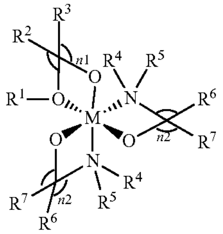

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(e)

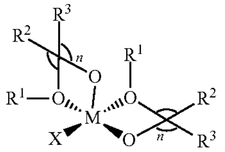

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein $X{=}OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; and at least one of $R^1$ though $R^6$ is a fluorine or fluorocarbon;

(f)

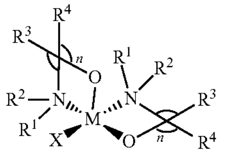

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein $X{=}OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(g)

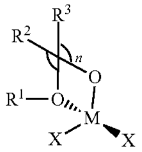

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forms 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; at least one of $R^1$ though $R^6$ is a fluorine or fluorocarbon;

(h)

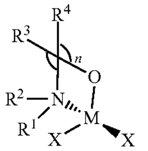

wherein M is Al, Ga, or In; $R^1$, $R^2$, $R^3$, and $R^4$ are independently selected from hydrogen, fluorine, linear, branched or cyclic alkyl groups, fluorocarbons, or aryl groups with between 1 and 12 carbons; wherein n=1-3 forms 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(i)

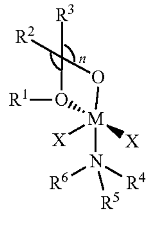

wherein M is Al, Ga, or In; $R^2$, $R^3$, $R^4$, $R^5$ and $R^6$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^7$ or $NR^8R^9$; $R^7$ is not hydrogen but independently selected from linear, branched or cyclic alkyl groups, fluorocarbons, or aryl groups with between 1 and 12 carbons; $R^8$ and $R^9$ are independently selected from hydrogen, fluorine, linear, branched or cyclic alkyl groups, fluorocarbons, or aryl groups with between 1 and 12 carbons; at least one of $R^1$ though $R^9$ is a fluorine or fluorocarbon;

(j)

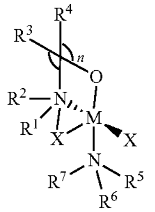

wherein M is Al, Ga, or In; $R^1$, $R^2$, $R^3$, $R^4$, $R^5$, $R^6$ and $R^7$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^8$ or $NR^9R^{10}$; $R^8$ is not hydrogen but independently selected from linear, branched or cyclic alkyl groups, fluorocarbons, or aryl groups with between 1 and 12 carbons; $R^9$ and $R^{10}$ are independently selected from hydrogen, fluorine, linear, branched or cyclic alkyl groups, fluorocarbons, or aryl groups with between 1 and 12 carbons; at least one of $R^1$ though $R^{10}$ is a fluorine or fluorocarbon. The disclosed method for forming a Group (III)-containing film may include one or more of the following features:

- further comprising the step of chemically reacting the chemisorbed and/or physisorbed film comprising the Group (III)-containing precursor with a co-reactant;
- the co-reactant reacting with the Group (III)-containing precursor and produces a reaction product that forms the Group (III)-containing film on the surface of the substrate;
- the co-reactant being $E(R_3M)_x$, where E is an element of group V or VI selected from P, As, Sb, S, Se, Te, and x=2 or 3, M is Si, Ge, or Sn and R is a alkyl group;
- the co-reactant being selected from $O_3$, $O_2$, $O_2$ plasma, $H_2O$, NO, $N_2O$, $NO_2$, $H_2O_2$, O radicals and combinations thereof;
- the co-reactant being selected from $NH_3$, NO, $N_2O$, hydrazines, $N_2$ plasma, $N_2/H_2$ plasma, $NH_3$ plasma, amines and combinations thereof;
- the Group (III)-containing film being InGaAs, $In_xO_y$ where x=0.5-1.5, y=0.5-1.5, InSnO (ITO), InGaZnO (IGZO), InN, InP, InAs, InSb, InSe, InTe, $In_2S_3$, $Ga_2O_3$, GaN, GaAs, $Al_2O_3$, AlN, AlP, AlAs, GaP, GaSb, or combination thereof;
- the Group (III)-containing film being $In_xO_y$, where x=0.5-1.5, y=0.5-1.5, selected from $In_2O_3$, $In_2O$, or In(I) oxide;
- the Group (III)-containing film being $In_2O_3$; and the co-reactant reacting with the Group (III)-containing precursor in the chemisorbed and/or physisorbed film producing a reaction product that forms the Group (III)-containing film on the surface of the substrate.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "wafer" or "patterned wafer" refers to a wafer having a stack of silicon-containing films on a substrate and a patterned film on the stack of silicon-containing films formed for pattern etch.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (including, but not limited to, crystalline, amorphous, porous, etc.), silicon containing layers (including, but not limited to, $SiO_2$, SiN, SiON, SiCOH, etc.), metal or metal containing layers (including, but not limited to, copper, cobalt, ruthenium, tungsten, platinum, palladium, nickel, ruthenium, gold, etc.) or combinations thereof. Furthermore, the substrate may be planar or patterned. The substrate may be an organic patterned Iodinated carbon layer film. The substrate may include layers of oxides which are used as dielectric materials in field effect transistor (FET) such as FinFET, MOFSET, GAAFET (Gate all-around FET), Ribbon-FET, Nanosheet, Forksheet FET, Complementary FET (CFET), MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate may be any solid that has functional groups on its surface that are prone to react with the reactive head of a SAM, and may include without limitation 3D objects or powders.

The term "processing" as used herein includes deposition of material, patterning, exposure, development, etching, cleaning, and/or removal of the material as required in forming a described structure.

The term of "deposit" or "deposition" refers to a series of processes where materials at atomic or molecular levels are deposited on a wafer surface or on a substrate from a gas state (vapor) to a solid state as a thin layer. Chemical reactions are involved in the process, which occur after creation of a plasma of the reacting gases or activation the reacting gases by heat. The plasma may be a capacitively coupled plasma (CCP), generally created by radio frequency (RF) (alternating current (AC)) frequency or direct current (DC) discharge between two electrodes, the space between which is filled with the reacting gases. The plasma may also be microwave plasma. Suitable commercially available deposition tool include but are not limited to the ASM EPSILON™ EPITAXY or the Applied Materials Centura™ tool or other furnace, thermal, and epitaxy deposition tools. Deposit may also refer to a process of exposing the wafer to the liquid precursor (neat or dissolved in a solvent) by dip coating, immersion, or in a spin coating process.

The term "aspect ratio" refers to a ratio of the height of a trench (or aperture) to the width of the trench (or the diameter of the aperture).

The term "high aspect ratio (HAR)" refers to an aspect ratio ranging from approximately 1:1 to approximately 500:1, preferably from approximately 20:1 to approximately 400:1.

Note that herein, the terms "film", "nanosheet" and "layer" may be used interchangeably. It is understood that a film may correspond to, or related to a layer or a nanosheet, and that the nanosheet may refer to the layer or the film. Furthermore, one of ordinary skill in the art will recognize that the terms "film", "nanosheet", or "layer" used herein refer to a thickness of some material laid on or spread over a surface and that the surface may range from as large as the entire wafer to as small as a trench or a line.

Note that herein, the terms "aperture", "via", "hole", "structure" and "trench" may be used interchangeably to refer to an opening formed in a semiconductor structure.

The term "step coverage" refers to a ratio of thickness of film along the walls of a step to the thickness of the film at the bottom of a step.

Note that herein, the terms "step coverage" and "conformality" may be used interchangeably to refer to the quality of a deposited film formed in a semiconductor structure, pattern or 3D structure. It is the measure of how much coating is on the bottom or sidewall of a structure as compared to how much coating is at the top of a structure.

The term "nanosheet" or "nanostructured material" or "nanoscaled material" refers to a two-dimensional nanostructure with thickness in a scale ranging from 1 to 100 nm.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "compound" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

Note that herein, the terms "film forming composition" refers to, but is not limited to, a mixture of a precursor, and/or an additional precursor, an oxidizer or a reduced reagent, a co-reactant, an inert gas, an additive, etc. introduced into a reactor for forming a film on a surface of a substrate. The film forming composition may vary. The film forming composition may be just a precursor, or a mixture of a precursor, an oxidizer and an inert gas.

Note that herein, the terms "dope", and "dopant" is used interchangeably to the process of incorporation of one or more elements into a film through various methods where that element may be chemically bond or physically bond. The element may be doped interstitial or substitutional within the film. As used herein, the term "doping" refers to the process of intentionally incorporating atoms of different elements into the film composition.

The term "heats of vaporization" refers to the amount of energy required to transition one mole of material into a vapor phase. The lower the heat of vaporization, typically the higher volatility.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Disclosed are fluorination of ancillary ligands of Group (III) precursors for enhanced volatility, thermal stability, and reactivity during vapor deposition of Group (III) containing thin films and nanostructured materials. More specifically, a strategy for improving precursor heats of vaporization, volatility, thermal stability, and reactivity of the Group (III) precursors via fluorination of supporting ancillary ligands. Fluorine may be strategically incorporated into the ancillary ligands to systematically modulate electronic and physical properties of organometallic complexes. This synthesis and precursor design strategy has resulted in disclosing herein new classes of Group (III) molecules as viable precursors for Group III-containing thin films and nanostructured materials by deposition processes.

Fluorine is the most electronegative and least polarizable element, which results in a small atomic size (van der Waals radius, 1.47 Å). In addition, the high electronegativity of fluorine relative to carbon results in highly polar and strong C—F bonds, relative to C—H bonds. The combination of the strong C—F bonds and the small size makes it possible for fluorine to take the place of the hydrogens in organic molecules without affecting steric properties. Furthermore, electron withdrawing nature of fluorine also results in strengthening skeletal bonds in organic moiety, which imparts greater thermal stability. The low polarizability of fluorine results in low surface energies, thus, weak intermolecular attraction, which manifests in lowered heats of vaporization and increased volatility. For example, the heats of vaporization of perfluoro-n-hexane boils at 12° C. is lower than that of perprotio-n-hexane, despite perprotio-n-hexane having a molecular weight roughly four times greater.

Figure 1:
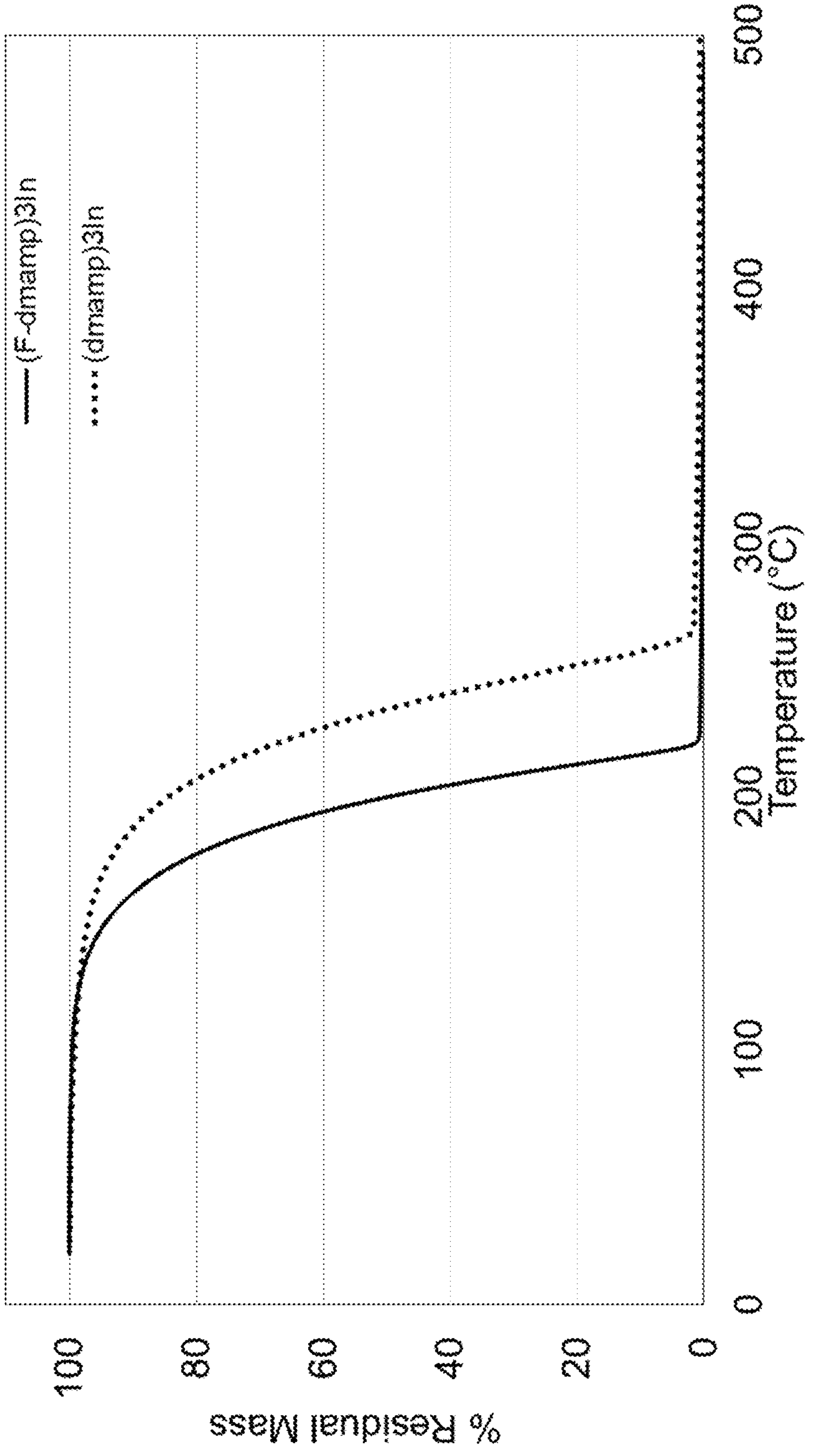
FIG. 1 is atmospheric TGA showing the increased volatility of a new indium complex, (F-dmamp)$_3$In, with fluorinated amino alcohol ligands (0.5% residue at 225° C., solid line) relative to the known indium precursor, (dmamp)$_3$In, (1.6% residue at 267° C., dashed line)
Figure 2:
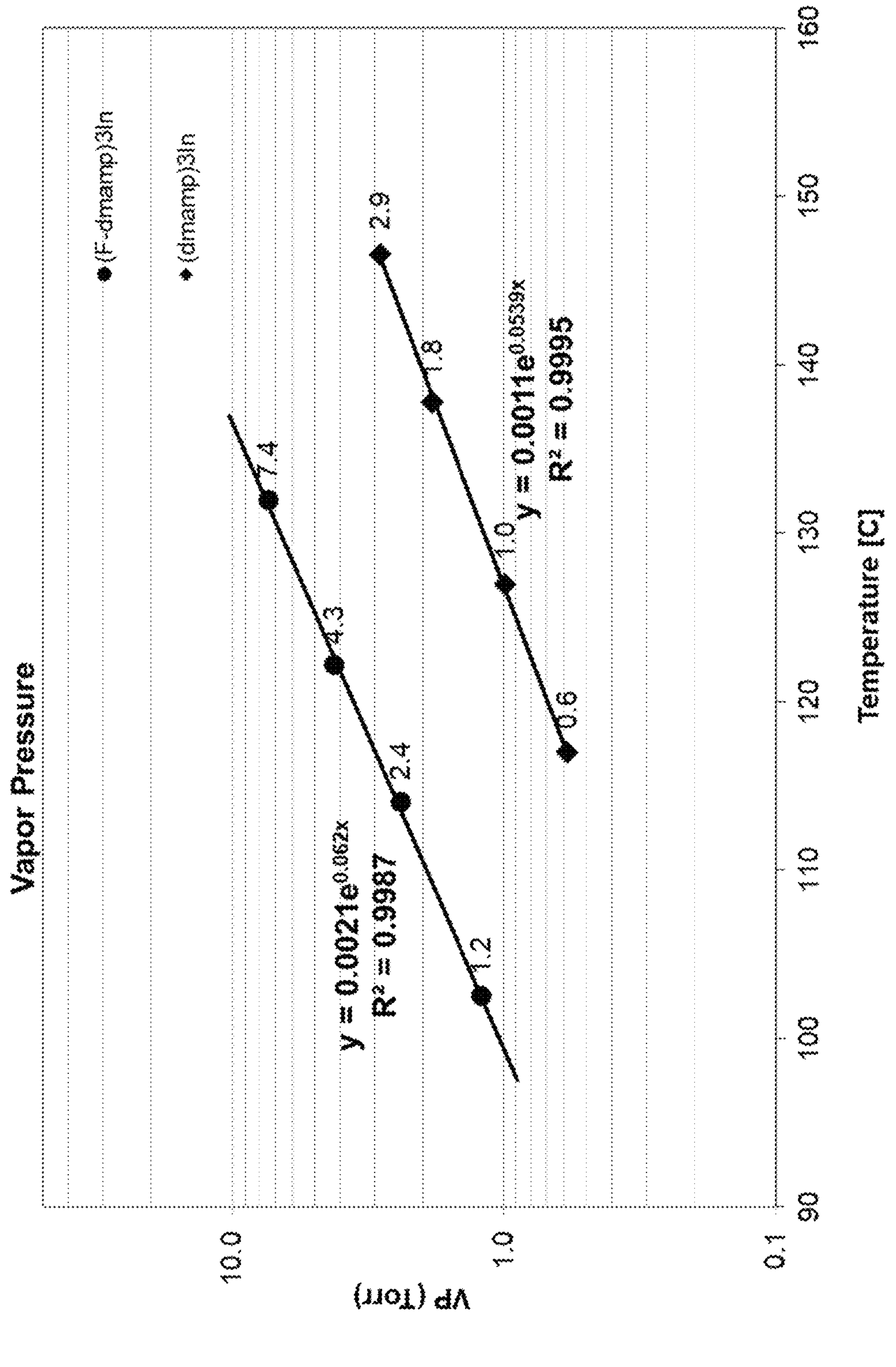
FIG. 2 is a comparison of the vapor pressures of novel (F-dmamp)$_3$In to reported (dmamp)$_3$In as a function of temperature.

The disclosed fluorination of ancillary bidentate and/or monodentate ligands may result in increased volatility and thermal stability of the Group (III) containing precursors. For example, synthesized tris(fluorinated amino-alkoxy)

precursor, tris(2-(dimethylamino)methyl-1,1,1,3,3,3-hexafluoropropan-2-ol)indium, represented as (F-dmamp)$_3$In, displays much increased volatility and thermal stability relative to non-fluorinated (dmamp)$_3$In, see the Examples that follow. This increased volatility is demonstrated in atmospheric thermogravimetric analysis (TGA) where complete evaporation of (F-dmamp)$_3$In is observed at 225° C. vs. 267° C. for (dmamp)$_3$In (FIG. 1). Furthermore, (dmamp)$_3$In and (F-dmamp)$_3$In possess a 1 torr vapor pressure at 127° C. and 97° C., respectively, corresponding to a 30° C. decrease in required temperature despite (F-dmamp)$_3$In being approximately double the molecular weight of (dmamp)$_3$In (FIG. 2).

Figure 3:
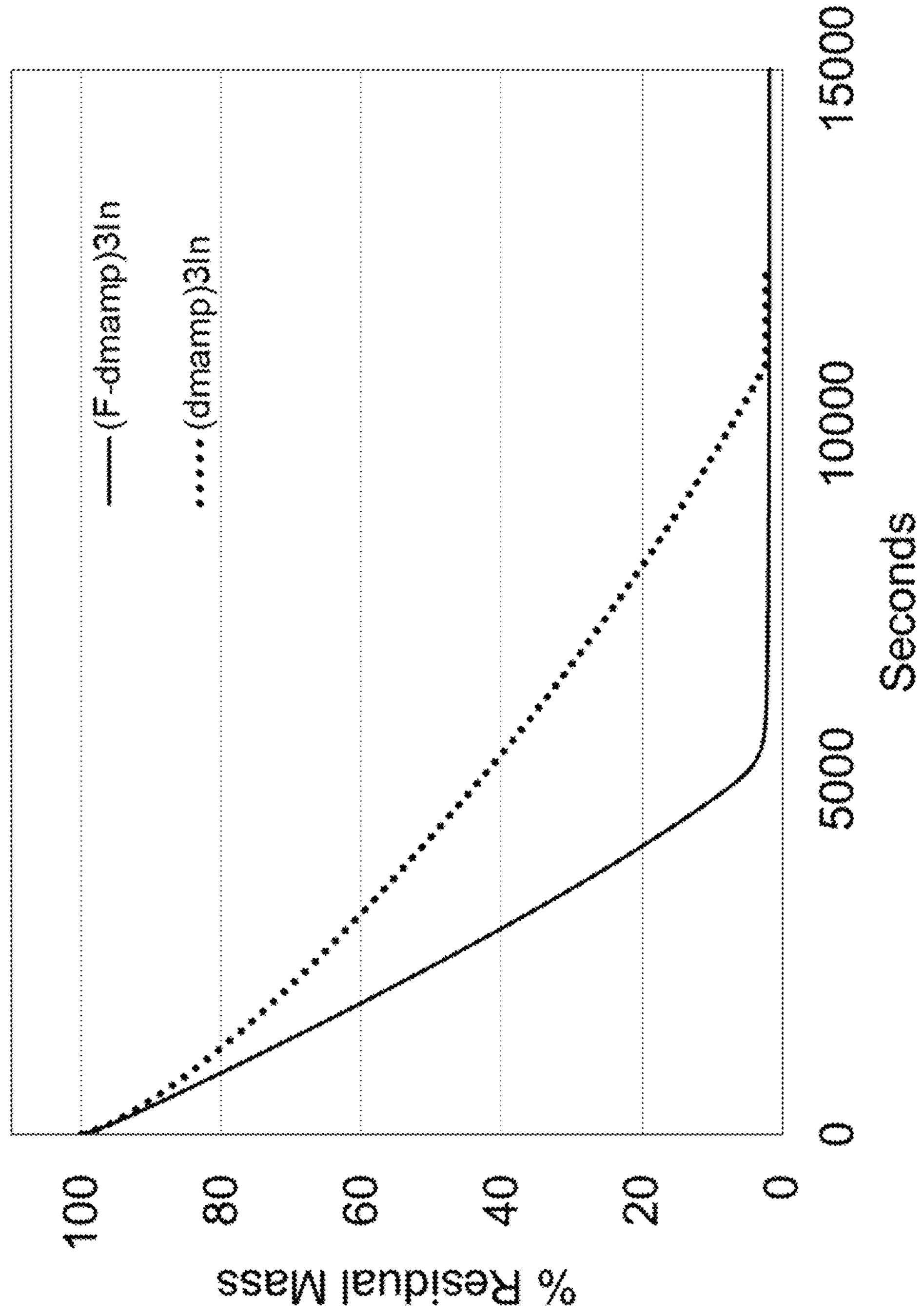
FIG. 3 is a comparison of the mass loss of novel (F-dmamp)$_3$In to reported (dmamp)$_3$In as a function of time during isothermal TGA analysis at 150° C.

In addition to an increase of volatility, (F-dmamp)$_3$In displays moderately increased thermal stability relative to (dmamp)$_3$In (FIG. 3). The mass loss of (F-dmamp)$_3$In as a function of time at 150° C. maintains linearity until complete mass loss with minimal residue (~2%). However, mass loss for (dmamp)$_3$In deviates from linearity with time. This observed curvature during the TGA isotherm is indicative of a chemical change or decomposition occurring during the course of analyses.

The disclosed Group (III) containing precursors are compatible with traditional processes for III-V/III-VI vapor deposition, using traditional co-reagents, e.g., $H_2O$ or $O_3$ for $M_2O_3$ and tBuAs for thermal MAs, where M=Al, In or Ga. Moreover, these molecules are compatible with dealkoxysilylation chemistries. Dealkoxysilylation chemistries offer some advantages with respect to the reaction driving force when the reaction chemistry promotes Group (III)-containing deposition, instead of thermal processes (>350° C.) or strong oxidants, e.g., $O_3$ for Group (III) metal oxide deposition, which are incompatible with device fabrication. Group (III) alkoxides possess a relatively weak M-O bond, e.g., bond-dissociation energy (BDE) of In—O=360 kJ/mol. Thus, the dealkoxysilylation reaction to cleave the M-O bond with subsequent formation of a much stronger Si—O bond (BDE=798 kJ/mol) is predicted to provide a highly favorable driving force.

The disclosed Group (III) precursors for vapor phase deposition of Group (III) containing films include both heteroleptic and homoleptic Group (III) precursors for deposition applications. All novel precursors disclosed here contain at least one fluorocarbon group on at least one of ancillary ligands. This addition allows for increased volatility of the precursors resulting in improved deposition features. The heteroleptic and homoleptic Group (III) precursors may have coordination sphere that may be occupied by bis-chelating ligands with ether/alkoxide or amine/alkoxide moieties, in addition to monodentate alkoxide or amine ligands.

The disclosed Group (III)-containing precursors are of the following formulae:

(a)

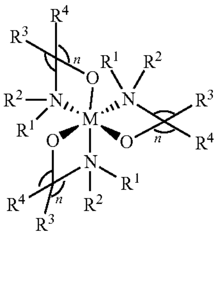

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons;

(b)

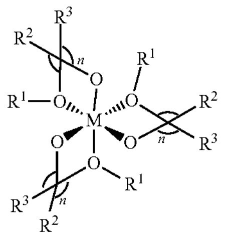

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^3$ is a fluorine or fluorocarbon; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons;

(c)

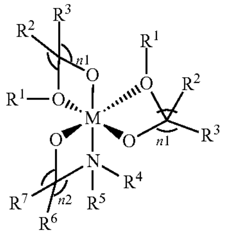

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(d)

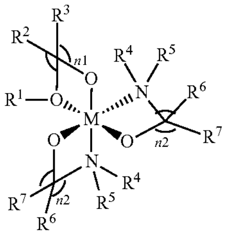

wherein M is Al, Ga, or In; $R^2$, $R^3$, $R^4$, $R^5$, $R^6$, and $R^7$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; and at least one of $R^1$ though $R^7$ is a fluorine or fluorocarbon; wherein n1 and n2=1-3 forming 4- to 6-membered chelates and n1 and n2 do not have to be equal; provided that if n1 and n2 is greater than or equal to 2, $R^2$, $R^3$, $R^6$, and $R^7$ substituents of additional carbon units do not have to be identical and may also be independently selected from hydrogen, fluorine, linear, branched or cyclic alkyl groups, fluorocarbons, or aryl groups with between 1 and 12 carbons;

(e)

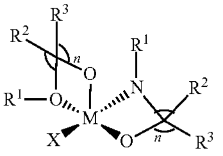

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; and at least one of $R^1$ though $R^6$ is a fluorine or fluorocarbon;

(f)

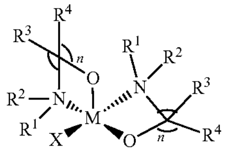

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(g)

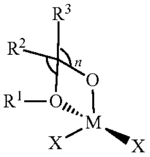

wherein M is Al, Ga, or In; $R^2$ and $R^3$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forms 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^4$ or $NR^5R^6$ and $R^4$ is not hydrogen but independently selected from linear, branched or cyclic alkyl groups, fluorocarbons, or aryl groups with between 1 and 12 carbons; $R^5$ and $R^6$ are independently selected from hydrogen, fluorine, linear, branched or cyclic alkyl groups, fluorocarbons, or aryl groups with between 1 and 12 carbons; at least one of $R^1$ though $R^6$ is a fluorine or fluorocarbon;

(h)

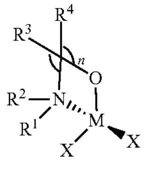

wherein M is Al, Ga, or In; $R^1$, $R^2$, $R^3$, and $R^4$ are independently selected from hydrogen, fluorine, linear, branched or cyclic alkyl groups, fluorocarbons, or aryl groups with between 1 and 12 carbons; wherein n=1-3 forms 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X═$OR^5$ or $NR^6R^7$ and $R^5$ is not hydrogen but independently selected from linear, branched or cyclic alkyl groups, fluorocarbons, or aryl groups with between 1 and 12 carbons; $R^6$ and $R^7$ are independently selected from hydrogen, fluorine, linear, branched or cyclic alkyl groups, fluorocarbons, or aryl groups with between 1 and 12 carbons; at least one of $R^1$ though $R^7$ is a fluorine or fluorocarbon;

(i)

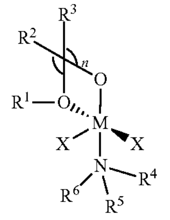

wherein M is Al, Ga, or In; $R^2$, $R^3$, $R^4$, $R^5$ and $R^6$ are independently selected from hydrogen, fluorine, linear, branched or cyclic alkyl groups, fluorocarbons, or aryl groups with between 1 and 12 carbons; $R^1$ is not hydrogen but independently selected from linear, branched or cyclic alkyl groups, fluorocarbons, or aryl groups with between 1 and 12 carbons; wherein n=1-3 forming 4- to 6-membered chelates; provided that if n is greater than or equal to 2, $R^2$ and $R^3$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^7$ or $NR^8R^9$; $R^7$ is not hydrogen but independently selected from linear, branched or cyclic alkyl groups, fluorocarbons, or aryl groups with between 1 and 12 carbons; $R^8$ and $R^9$ are independently selected from hydrogen, fluorine, linear, branched or cyclic alkyl groups, fluorocarbons, or aryl groups with between 1 and 12 carbons; at least one of $R^1$ though $R^9$ is a fluorine or fluorocarbon;

(j)

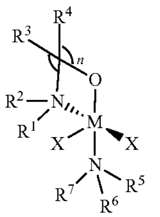

wherein M is Al, Ga, or In; $R^1$, $R^2$, $R^3$, $R^4$, $R^5$, $R^6$ and $R^7$ are independently selected from hydrogen, fluorine, linear, branched or cyclic alkyl groups, fluorocarbons, or aryl groups with between 1 and 12 carbons; wherein n=1-3 forming 4- to 6-membered chelates; provided that if n is greater than or equal to 2, $R^3$ and $R^4$ substituents of additional carbon units do not have to be identical and may also be independently selected from hydrogen, fluorine, linear, branched or cyclic alkyl groups, fluorocarbons, or aryl groups with between 1 and 12 carbons; wherein X=$OR^8$ or $NR^9R^{10}$; $R^8$ is not hydrogen but independently selected from linear, branched or cyclic alkyl groups, fluorocarbons, or aryl groups with between 1 and 12 carbons; $R^9$ and $R^{10}$ are independently selected from hydrogen, fluorine, linear, branched or cyclic alkyl groups, fluorocarbons, or aryl groups with between 1 and 12 carbons; at least one of $R^1$ though $R^{10}$ is a fluorine or fluorocarbon.

Exemplary disclosed Group III-containing precursors include Tris(2-(dimethylamino)methyl-1,1,1,3,3,3-hexafluoropropan-2-ol)indium, represented as $(F\text{-}dmamp)_3In$,

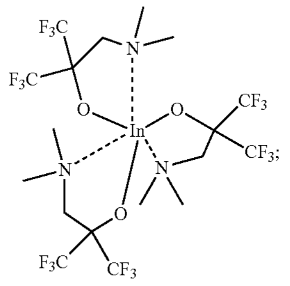

Tris(2-(ethylmethylamino)methy-1,1,1,3,3,3-hexafluoro-propn-2-ol)indium,

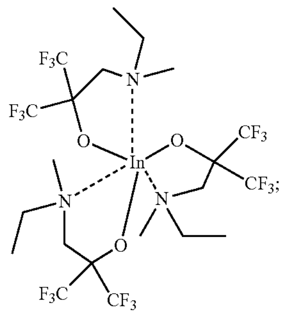

Tris(1,1,1,3,3,3-hexafluoro-2-(((2,2,2-trifluoroethyl)amino)methyl)propan-2-ol)indium,

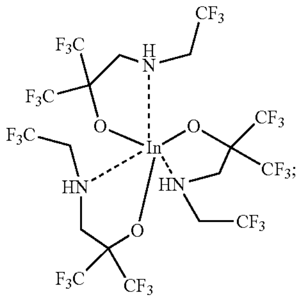

Tris(3-(dimethylamino)-1,1,1-trifluoropropan-2-ol)indium,

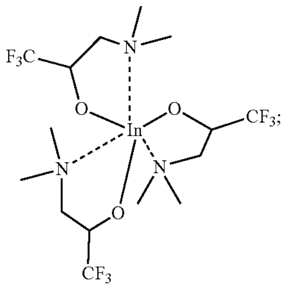

Tris(2-(dimethylamino)-1,1,1,3,3,3-hexafluoropropan-2-ol) indium,

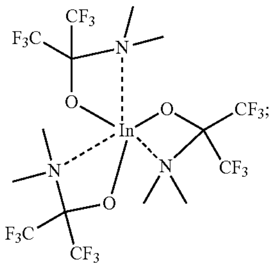

Bis((2-((dimethylamino)methyl)-1,1,1,3,3,3-hexafluoropropan-2-ol)(ethoxy)indium,

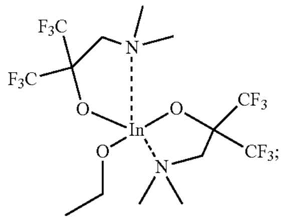

Bis((2-((dimethylamino)methyl)-1,1,1,3,3,3-hexafluoropropan-2-ol)(dimethylamide) indium,

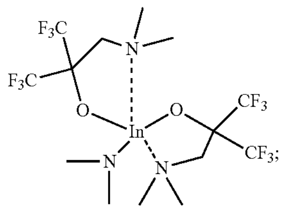

Tris(1,1,1,3,3,3-hexafluoro-2-(methoxymethyl)propan-2-ol) indium, represented as (F-mmp)$_3$In,

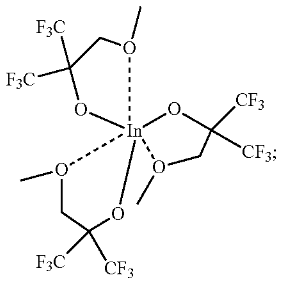

Tris(1,1,1-trifluoro-3-methoxypropan-2-ol)indium,

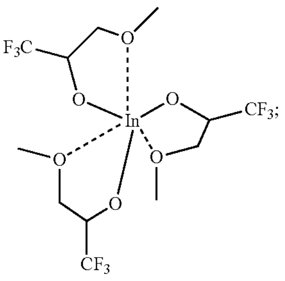

Tris(3-ethoxy-1,1,1-trifluoropropan-2-ol)indium,

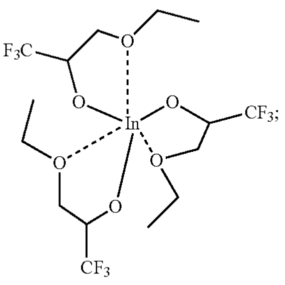

Tris(1,1,1,3,3,3-hexafluoro-2-((2,2,2-trifluoroethoxy) methyl)propan-2-ol)indium,

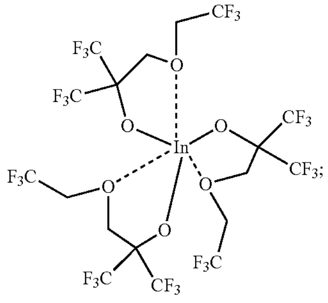

Tris(2-(ethoxymethyl)-1,1,1,3,3,3-hexafluoropropan-2-ol) indium,

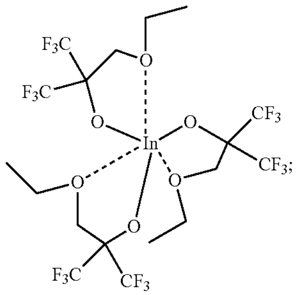

Tris(1,1,1,3,3,3-hexafluoro-2-methoxypropan-2-ol)indium,

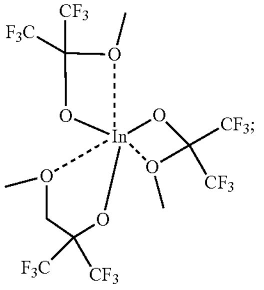

1,1,1,3,3,3-hexafluoro-2-(methoxymethyl)propan-2-olate bis(2-((dimethylamino)methyl)-1,1,1,3,3,3-hexafluoropropan-2-ol)indium,

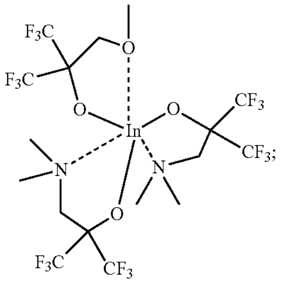

Bis(1,1,1,3,3,3-hexafluoro-2-(methoxymethyl)propan-2-olate) 2-((dimethylamino)methyl)-1,1,1,3,3,3-hexafluoropropan-2-ol)indium,

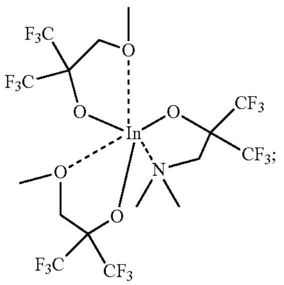

Bis(1,1,1,3,3,3-hexafluoro-2-(methoxymethyl)propan-2-olate) 2-(dimethylamino)-1,1,1,3,3,3-hexafluoropropan-2-ol,

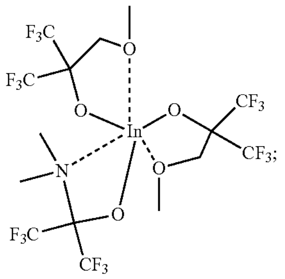

Bis(1,1,1,3,3,3-hexafluoro-2-(methoxymethyl)propan-2-ol) (ethoxy)indium,

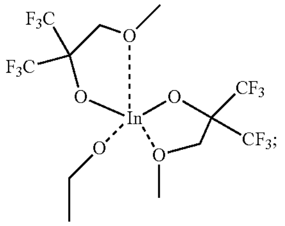

Bis(1,1,1,3,3,3-hexafluoro-2-(methoxymethyl)propan-2-ol) (dimethylamide)indium,

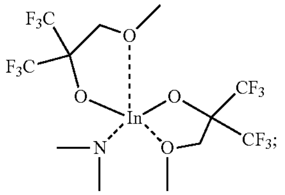

Tris(2-(dimethylamino)methyl-1,1,1,3,3,3-hexafluoropropan-2-ol)gallium,

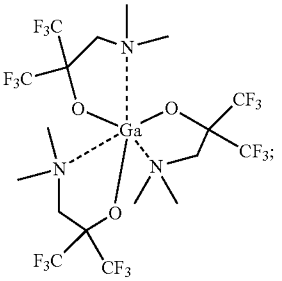

Tris(1,1,1,3,3,3-hexafluoro-2-methoxymethyl)propan-2-ol) gallium,

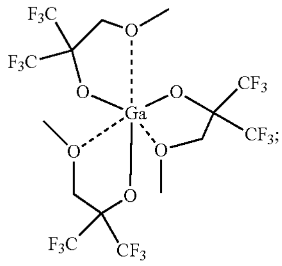

Tris(1,1,1,3,3,3-hexafluoro-2-(methoxymethyl)propan-2-ol) aluminum,

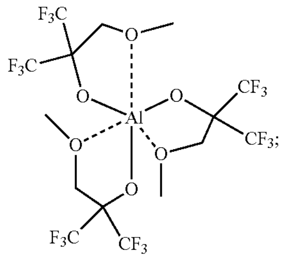

and bis((2-((dimethylamino)methyl)-1,1,1,3,3,3-hexafluoropropan-2-ol)(ethoxy)aluminum,

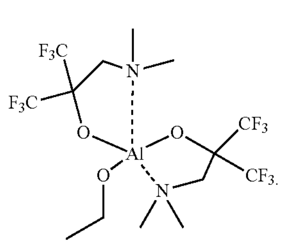

The disclosed are Group III-containing film forming compositions comprise the disclosed Group III-containing precursors. The disclosed Group III-containing precursors contain less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by purification (e.g., distillation, sublimation, chromatography, etc.) of the Group (III)-containing precursors.

Purity of the disclosed Group (III)-containing precursors is greater than 93% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to approximately 99.999% w/w or 99.0% w/w to 100.0% w/w). One of ordinary skill in the art will recognize that the purity may be determined by NMR spectroscopy and gas or liquid chromatography with mass spectrometry, or the like. The disclosed Group III-containing precursors may contain any of the following impurities: pyrazoles; pyridines; alkylamines; alkylimines; ethers; pentane; cyclohexane; heptanes; benzene; toluene; halogenated metal compounds; lithium, sodium, potassium. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w).

The disclosed Group III-containing precursors may be purified by recrystallization, sublimation, distillation, and/or passing through a suitable adsorbent, such as 4 Å molecular sieves.

Purification of the disclosed Group (III)-containing precursors may also result in metal impurities each range independently at the 0 ppbw to 1 ppmw, preferably approximately 0 to approximately 500 ppbw (part per billion weight) level, more preferably from approximately 0 ppbw to approximately 100 ppbw, and even more preferably from approximately 0 ppbw to approximately 10 ppbw. These metal or metalloid impurities include, but are not limited to, Al, As, Ba, Be, Bi, Cd, Ca, Cr, Co, Cu, Ga, Ge, Hf, In, Zr, Fe, Pb, U, Mg, Mn, W, Ni, K, Na, Si, Sr, Th, Sn, Ti, U, V and Zn.

Care should be taken to prevent exposure of the disclosed group III-containing precursors to water as this may result in decomposition of the group III-containing precursors to a metal oxide (e.g., $In_2O_3$).

The disclosed group III-containing precursors may have high thermal stability and may be used for forming high-speed, high sensitivity semiconductor layers, e.g. in CMOS systems, 3D NAND Channel or in photodetectors. The disclosed group III-containing precursors are suitable to deposit the corresponding element-containing films and its related use for deposition of the corresponding element-containing layers.

The disclosed group III-containing precursors are suitable for forming metal-containing thin films, such as InGaAs, $In_xO_y$ (x=0.5-1.5, y=0.5-1.5) (e.g., $In_2O_3$, $In_2O$, In(I) oxide), InSnO (ITO), InGaZnO ($In_2Ga_2ZnO_7$, IGZO), InN, InP, InAs, InSb, InSe, InTe, $In_2S_3$, $Ga_2O_3$, GaN, GaAs, $Al_2O_3$, AlN, AlP, AlAs, GaP, GaSb, etc. used in electronic fields. The disclosed group III)-containing precursors are useful for the fabrication of indium tin oxide in displays, solar cells, high speed electronic (InN), optoelectronic components, high-speed electronics, photovoltaics (InP), infrared detectors, diode laser (InAs), fast transistors, magnetic field, thermal image detectors (InSb), photoelectronic devices, photoelectrochemical water splitting ($In_2S_3$), LED applications, the fabrication of copper indium gallium selenide (CIGS) in photovoltaics and optical applications, indium gallium zinc oxide (IGZO) in displays, semiconductors, Logic and memories industries, and the like.

The disclosed also include processes for forming a metal-containing film and methods for forming a metal-containing film using the disclosed Group (III)-containing precursors by vapor deposition methods, such as chemical vapor deposition (CVD) or atomic layer deposition (ALD). Examples of suitable deposition methods include CVD or ALD with or without plasma enhancement. Exemplary ALD methods include thermal ALD, plasma enhanced ALD (PE-ALD), spatial isolation ALD, temporal ALD, selective or not ALD, hot-wire ALD (HWALD), radicals incorporated ALD, aerosol assisted ALD (AA-ALD), direct liquid injection ALD (DLI-ALD) and combinations thereof. The deposition method is preferably thermal ALD, PE-ALD, or spatial ALD in order to provide suitable step coverage and film thickness control. Exemplary CVD methods include metal-organic CVD (MOCVD), thermal CVD, pulsed CVD (PCVD), low pressure CVD (LPCVD), sub-atmospheric CVD (SACVD) or atmospheric pressure CVD (APCVD), hot-wire CVD or hot filament CVD (also known as cat-CVD, in which a hot wire serves as an energy source for the deposition process), hot wall CVD, cold wall CVD, aerosol assisted CVD, direct liquid injection CVD, combustion CVD, hybrid physical-CVD, metalorganic CVD, rapid thermal CVD, photo-initiated CVD, laser CVD, radicals incorporated CVD, plasma enhanced CVD (PECVD) including but not limited to flowable PECVD, and combinations thereof. The disclosed are a deposition process where the disclosed Group (III)-containing precursors are used and introduced into a reaction chamber for deposition a film by ALD, CVD, spin-on, spray, dip coating, slit coating or any other deposition technique to form a film, in combination with or without one or more oxidants (for example $O_2$ and $O_3$, or $H_2O$ and $O_3$), or with one or more reductants or nitriding agents (for example $H_2$ and $NH_3$, $N_2$ and $NH_3$, or $NH_3$ and $N_2H_4$) introduced simultaneously and/or sequentially.

The disclosed deposition processes using the disclosed Group (III)-containing precursors may be assisted by heating, light, direct or remote plasma, or combination thereof. The disclosed deposition processes using the disclosed Group (III)-containing precursors further comprises, prior to heating, activating a plasma, or the like, sequentially or simultaneously exposing a substrate to a co-reactant.

When a target deposition film is a dielectric film, the co-reactant may be an oxidizing gas such as one of $O_2$, $O_3$, $H_2O$, $H_2O_2$, NO, $N_2O$, $NO_2$, oxygen containing radicals such as $O^{\cdot}$ or $OH^{\cdot}$, alcohol, silanols, aminoalcohols, carboxylic acids such as formic acid, acetic acid, propionic acid, para-formaldehyde, other oxidizing compounds and mixtures thereof. When an oxidizing agent is used as the co-reactant, the resulting Group (III)-containing film will also contain oxygen.

When a target deposition film is a conductive film, the co-reactant may be $NH_3$, $N_2$, $H_2$ or $N_2/H_2$, amines, diamines, cyanides, di-imines, hydrazines (for example, $N_2H_4$, $MeHNNH_2$, MeHNNHMe), organic amines (for example, $H_2N(CH_3)$, $H_2N(CH_2CH_3)$, $H_2NC(CH_3)_3$, $N(CH_3)_2H$, $N(C_2H_5)_2H$, N(CHs)s, $N(C_2H_5)_3$, $(SiMe_3)_2NH$), pyrazoline, pyridine, radical and plasma species, and mixtures thereof. The co-reactant may be a primary amine, a secondary amine, a tertiary amine, trisilylamine, radicals thereof, and mixtures thereof. Preferably, the co-reactant is $NH_3$ or $H_2$. When an N-containing reducing agent is used, the resulting a target deposition film will also contain nitrogen.

When a target deposition film contains another element, for example and without limitation, P, Ga, As, B, Ge, Ta, Hf, Nb, Mg, Al, Sr, Y, Ba, Ca, Sb, Bi, Sn, Pb, Co, lanthanides (such as Er), or combinations thereof, the co-reactants may include another precursor.

The disclosed Group (III)-containing precursors are capable of surface saturation, self-limited growth per cycle, and perfect step coverage on an aspect ratio ranging from approximately 5:1 to approximately 500:1, preferably from approximately 20:1 to approximately 400:1.

The disclosed Group (III)-containing precursors may be supplied either in neat form or in a blend with a suitable solvent, such as ethyl benzene, xylene, mesitylene, decalin, decane, dodecane. The disclosed precursors may be present in varying concentrations in the solvent.

The neat or in a blended Group (III)-containing precursors are introduced into a reactor in a vapor form by conventional means, such as tubing and/or flow meters.

The vapor form may be produced by vaporizing the neat blended composition through a conventional vaporization step such as direct vaporization, distillation, by bubbling, or by sublimation. The neat or in a blended Group (III)-containing precursors may be fed in liquid state to a vaporizer where it is vaporized before it is introduced into the reactor. Alternatively, the neat or in a blended Group (III)-containing precursors may be vaporized by passing a carrier gas into a container containing the composition by bubbling the carrier gas into the Group (III)-containing precursors. The carrier gas may include, but is not limited to, Ar, He, $N_2$, and mixtures thereof. Bubbling with a carrier gas may also remove any dissolved oxygen present in the neat or in a blended Group (III)-containing precursors. The carrier gas and composition are then introduced into the reactor as a vapor, If necessary, the container containing the disclosed Group (III)-containing precursors may be heated to a temperature that permits the precursor to have a sufficient vapor pressure. The container may be maintained at temperatures in the range of, for example, approximately 0° C. to approximately 200° C. Those skilled in the art will recognize that the temperature of the container may be adjusted in a known manner to control the amount of precursor vaporized.

The reactor may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reactor contains one more substrates onto which the films will be deposited. A substrate is generally defined as the material on which a process is conducted. The substrates may be any suitable substrates used in semiconductor, photovoltaic, fiat panel, LCD-TFT device manufacturing. Examples of suitable substrates include wafers, such as silicon, silica, glass, GaAs wafers. The wafer may have one or more layers of differing materials deposited on it from a previous manufacturing step. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide, metal nitride layers (Ti, Ru, Ta, etc.), and combinations thereof. Additionally, the wafers may include copper layers or noble metal layers (e.g., platinum, palladium, rhodium, or gold). The wafers may include barrier layers, such as manganese, manganese oxide, etc. Plastic layers, such as poly(3,4-ethylenedioxythiophene)poly(styrenesulfonate)[PEDOT:PSS] may also be used. The layers may be planar or patterned. The disclosed processes may deposit the layer directly on the wafer or directly on one or more layers on top of the wafer when patterned layers are formed on the substrate. The patterned layers may be alternating layers of two specific layers such as $In_2O_3$ and $ZrO_2$ used in 3D NAND. Furthermore, one of ordinary skill in the art will recognize that the terms "film" and "layer" used herein refer to a thickness of some material laid on or spread over a surface of the substrate and that the surface may be a trench or a line. Throughout the specification and claims, the wafer and any associated layers thereon are referred to as substrates.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reactor are held at conditions suitable for vapor depositions, such as ALD and CVD. In other words, after introduction of the vaporized disclosed Group (III) containing film forming composition into the chamber, conditions within the chamber are such that at least part of the precursor is deposited onto the substrate to form a layer. For instance, the pressure in the reactor or the deposition pressure may be held between about $10^{-3}$ torr and about 100 torr, more preferably between about $10^{-2}$ torr and 10 torr, as required per the deposition parameters. Likewise, the temperature in the reactor or the deposition temperature may be held between about 50° C. and about 600° C., preferably between about 150° C. and about 500° C. One of ordinary skill in the art will recognize that "at least part of the precursor is deposited" means that some all of the precursor reacts with adheres to the substrate.

The temperature to achieve optimal film growth may be controlled by either controlling the temperature of the substrate holder or the temperature of the substrate itself. Devices used to heat the substrate are known in the art. The substrate is heated to a sufficient temperature to obtain the desired film at a sufficient growth rate and with desired physical state and composition. A non-limiting exemplary temperature range to which the substrate may be heated includes from approximately 50° C. to approximately 600° C. When a plasma deposition process is utilized, the deposition temperature is preferably less than 400° C. Alternatively, when a thermal process is performed, the deposition temperature may range from approximately 100° C. to approximately 600° C.

Alternatively, the substrate may be heated to a sufficient temperature to obtain the desired Group (III)-containing film at a sufficient growth rate and with desired physical state and composition. A non-limiting exemplary temperature range to which the substrate may be heated includes from room temperature to approximately 600° C. Preferably, the temperature of the substrate remains less than or equal to 500° C.

The ALD and/or CVD conditions within the chamber allow the disclosed Group (III)-containing precursors adsorbed or chemisorbed on the substrate surface to react and form a film on the substrate.

The reactor may be purged with an inert gas between the introduction of each of the film forming composition, such as, the precursor, any additional precursors, the co-reactants, the inert gas, and the like.

Depending on particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 1 to 100 nm, depending on specific deposition processes. The deposition process may also be performed as many times or cycles as necessary to obtain a desired film.

The disclosed methods for forming a Group (III)-containing film on a substrate comprise: placing a substrate in a reactor, delivering into the reactor a vapor of a disclosed Group (III)-containing film-forming composition that contains a disclosed Group (III)-containing precursor, and contacting/adsorbing the vapor with the substrate (and typically directing the vapor to the substrate) to form the Group (III)-containing layer on the surface of the substrate. Alternatively, the disclosed methods for forming a Group (III)-containing layer on a substrate comprise: exposing the substrate to a vapor of a disclosed Group (III)-containing film-forming composition that contains a disclosed Group (III)-containing precursor, and depositing the Group (III)-containing layer on the surface of the substrate. Alternatively, the disclosed methods forming a Group (III)-containing film on a substrate comprise forming a chemisorbed and/or physisorbed film, on the surface of the substrate, of a Group (III)-containing precursor, and chemically reacting the chemisorbed and/or physisorbed film comprising the Group (III)-containing precursor with a co-reactant.

The vapor of the Group (III)-containing film forming composition is generated and then introduced into a reactor containing a substrate. The temperature and the pressure in the reaction chamber and the temperature of the substrate are held at conditions suitable for vapor deposition of at least part of the disclosed Group (III)-containing precursor onto the substrate. In other words, after introduction of the vaporized composition into the reactor, conditions within the reaction chamber are adjusted such that at least part of the precursor is deposited onto the substrate to form the Group (III)-containing layer. One of ordinary skill in the art will recognize that "at least part of the precursor is deposited" means that some or all of the precursor reacts with or adheres to the substrate. Herein, a co-reactant may also be used to help in formation of the Group (III)-containing layer.

The disclosed Group (III)-containing precursor and co-reactant may be introduced into the reactor either simultaneously (CVD), sequentially (ALD) or different combinations thereof. The reactor may be purged with an inert gas (e.g., $N_2$ or Ar) between the introduction of the Group (III)-containing precursor and the introduction of the co-reactant. Alternatively, the co-reactant and the Group (III)-containing precursor may be mixed together to form a co-reactant/precursor mixture, and then introduced to the reactor in a mixture form. Another example is to introduce the co-reactant continuously and to introduce the disclosed Group (III)-containing precursor by pulse (pulsed CVD).

The Group (III)-containing films resulting from the disclosed methods may include InGaAs, $In_xO_y$ (x=0.5-1.5, y=0.5-1.5) (e.g., $In_2O_3$, $In_2O$, In(I) oxide), InSnO (ITO), InGaZnO ($In_2Ga_2ZnO_7$, IGZO), InN, InP, InAs, InSb, InSe, InTe, $In_2S_3$, $Ga_2O_3$, GaN, GaAs, $Al_2O_3$, AlN, AlP, AlAs, GaP, GaSb, or combination thereof or a pure metal (In(0), Ga(0), or Al(0)) layer. The Group (III)-containing films may contain a second element selected from P, N, S, Ga, In, As, B, Ta, Hf, In Nb, Mg, Al, Sr, Y, Ba, Ca, Sb, Bi, Sn, Pb, Co, Zn, one or more lanthanides, or combinations thereof. One of ordinary skill in the art will recognize that by appropriate selection of the film forming composition and co-reactants, the desired film composition may be obtained.

Upon obtaining a desired film thickness, the film may be subject to further processing, such as thermal annealing, furnace-annealing, rapid thermal annealing, UV e-beam curing, and/or plasma gas exposure. Those skilled in the art recognize the systems and methods utilized to perform these additional processing steps. For example, the $In_2O_3$ film may be exposed to a temperature ranging from approximately 200° C. and approximately 1000° C. for a time ranging from approximately 0.1 second to approximately 7200 seconds under an inert atmosphere, an O-containing atmosphere, and combinations thereof.

After annealing, the films deposited by any of the disclosed processes may have a bulk resistivity at room temperature of approximately 50 μohm·cm to approximately 1,000 μohm·cm. Room temperature is approximately 20° C. to approximately 25° C. depending on the season. Bulk resistivity is also known as volume resistivity. One of ordinary skill in the art will recognize that the bulk resistivity is measured at room temperature on the films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Comparative Example 1: Synthesis of tris(1-dimethylamino-2-methyl-2-propoxy)indium [(dmamp)$_3$In]

An Indium complex, tris(1-dimethylamino-2-methyl-2-propoxy)indium [(dmamp)$_3$In], has been demonstrated to be a precursor for $In_2O_3$ ALD using a high concentration of $O_3$ with high flow rates and a canister temperature of 70° C., providing an Indium-precursor vapor pressure of <0.1 torr (Han et al., *Appl. Surf. Sci.,* 2016, 383, 1-8). This low vapor pressure is not suitable for other processes, including $In_2O_3$ having lower flowrates, which would result in pulse times too long for practical deposition processes of indium-containing thin films. Thermal stability studies herein have determined that heating (dmamp)$_3$In above 70° C., e.g., 80, 110, 130° C., to achieve a more process compatible vapor pressure results in thermal instability and observable precursor decomposition (~10% @80° C. and complete decomposition @130° C. after 8 weeks). This implies that this precursor would not be viable for incorporation into high-volume manufacturing. Furthermore, (dmamp)$_3$In, was compared to the fluorinated version, (F-dmamp)$_3$, Example 1 below. The increased volatility of the fluorinated compound, (F-dmamp)$_3$, relative to non-fluorinated (dmamp)$_3$In is demonstrated in the atmospheric TGA (FIG. 1). Additionally, (dmamp)$_3$In and (F-dmamp)$_3$In possess a 1 torr vapor pressure at 127° C. and 97° C., respectively, highlighting a 30° C. decrease in vapor temperature with the presence of fluorine (FIG. 2). Beyond the increased volatility of the fluorinated complexes, increased stability is observed when comparing, (dmamp)$_3$In and (F-dmamp)$_3$In as demonstrated by isotherm TGA experiment (FIG. 3). The mass loss of (F-dmamp)$_3$In as a function of time at 150° C. maintains linearity until complete mass loss with minimal residue (~2%). However, mass loss for (dmamp)$_3$In deviates from linearity.

Example 1: Synthesis of tris(2-(dimethylamino)methyl-1,1,1,3,3,3-hexafluoropropan-2-ol)indium, [(F-dmamp)$_3$In]

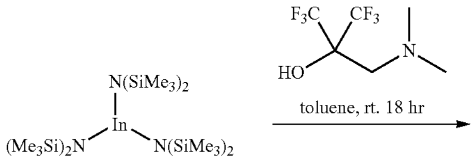

-continued

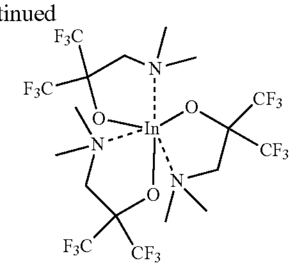

In a Schlenk flask under nitrogen, tris(bis(trimethylsilyl)amino)indium (1.00 equiv, 0.0043 mol, 2.56 grams) was dissolved in toluene. 2-((dimethylamino)methyl)-1,1,1,3,3,3-hexafluoropropan-2-ol (3.2 equiv, 0.013 mol, 2.88 grams) was slowly added to the reaction with stirring. The reaction was stirred at room temperature for 18 hours. The reaction was then taken to dryness in vacuo and the residue was washed with a hydrocarbon solvent, preferably heptane. Upon removing the solvent, a white solid was isolated and purified by vacuum sublimation at 80° C. at 80 mtorr to yield 2.45 grams (78%) of the pure product as a white solid. $^1$H-NMR (DMSO-$d_6$, δ (ppm)): 2.24 (18H, s), 2.52 (6H, s).

Example 2: Synthesis of tris(2-(ethylmethylamino)methyl-1,1,1,3,3,3-hexafluoropropan-2-ol)indium

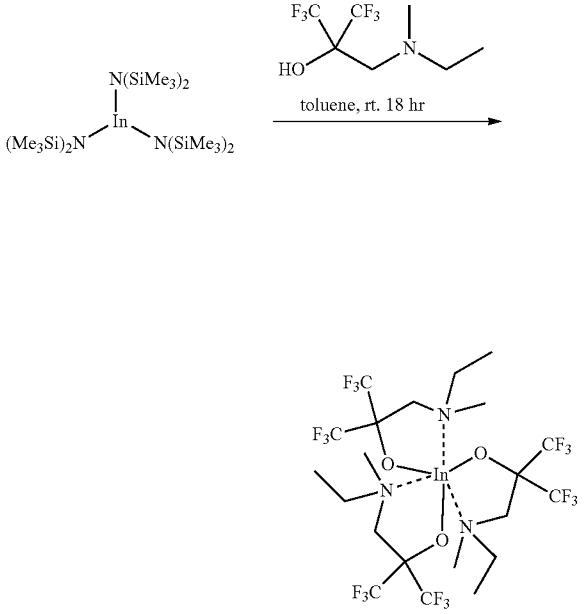

In a Schlenk flask under nitrogen, tris(bis(trimethylsilyl)amino)indium (1.00 equiv, 0.02 mol, 11.91 grams) was dissolved in toluene. 2-((ethyl(methyl)amino)methyl)-1,1,1,3,3,3-hexafluoropropan-2-ol (3.2 equiv, 0.064 mol, 15.30 grams) was slowly added to the reaction with stirring. The reaction was stirred at room temperature for 18 hours. The reaction was then taken to dryness in vacuo to yield a clear liquid. Crude material was purified by vacuum distillation @95° C. @<40 mtorr to yield 6.1 grams as a clear liquid (37% yield). $^1$H-NMR (DMSO-$d_6$, δ (ppm)): 2.55 (6H, s), 2.47 (6H, q, 7.2 Hz) 2.21 (9H, s), 0.94 (9H, t, 7.1 Hz).

Example 3: Synthesis of Tris(1,1,1,3,3,3-hexafluoro-2-(methoxymethyl)propan-2-ol)indium, [(F-mmp)$_3$In]

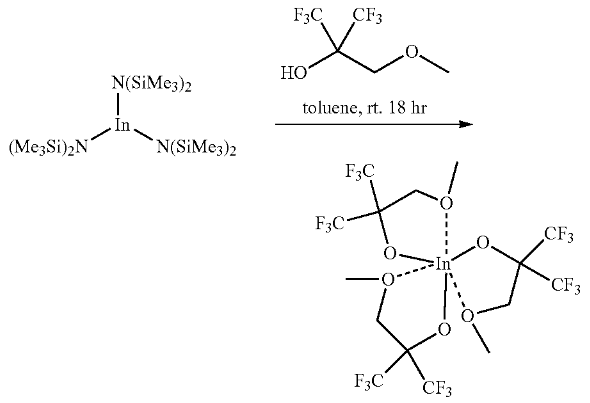

In a Schlenk flask under nitrogen tris(bis(trimethylsilyl)amino)indium (1.00 equiv, 0.014 mol, 8.16 grams) was dissolved in toluene. 1,1,1,3,3,3-hexafluoro-2-(methoxymethyl)propan-2-ol (3.2 equiv, 0.044 mol, 9.29 grams) was slowly added to the reaction with stirring. The reaction was stirred at room temperature for 18 hours. The reaction was then taken to dryness in vacuo to yield a white powder. Crude material was purified by vacuum sublimation @125° C. @<40 mtorr to yield 8.1 grams (79% yield). $^1$H-NMR (DMSO-d$_6$, δ (ppm)): 3.48 (6H, s), 3.27 (9H, s).

Example 4: Synthesis of Tris(1,1,1,3,3,3-hexafluoro-2-(methoxymethyl)propan-2-ol)indium

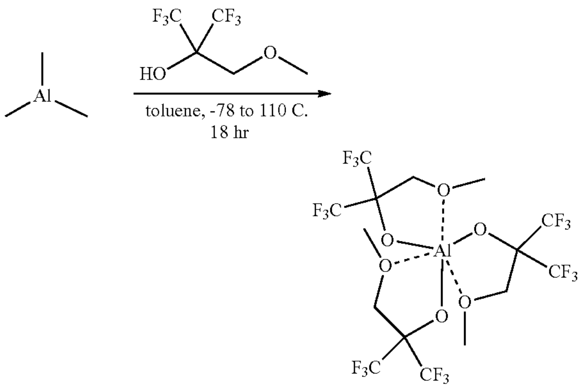

In a Schlenk flask under nitrogen trimethyl aluminum (2.0 M solution in toluene) (1.00 equiv, 0.004 mol, 2 mL) was dissolved in toluene (100 mL) in a flask fitted with reflux condenser and cooled to −78° C. with stirring. 1,1,1,3,3,3-hexafluoro-2-(methoxymethyl)propan-2-ol (3.5 equiv, 0.014 mol, 2.96 grams) was slowly added to the reaction with stirring. The reaction was warmed to room temperature and heated to reflux with stirring for 18 hours. The reaction was then taken to dryness in vacuo. A white solid was isolated and purified by vacuum sublimation @90° C. @<40 mtorr to yield 2.21 grams (83% yield). $^1$H-NMR (benzene-d$_6$, δ (ppm)): 3.36 (6H, s), 3.00 (9H, s).

Example 5: Synthesis of bis((2-((dimethylamino)methyl)-1,1,1,3,3,3-hexafluoropropan-2-ol)(ethoxy)aluminum

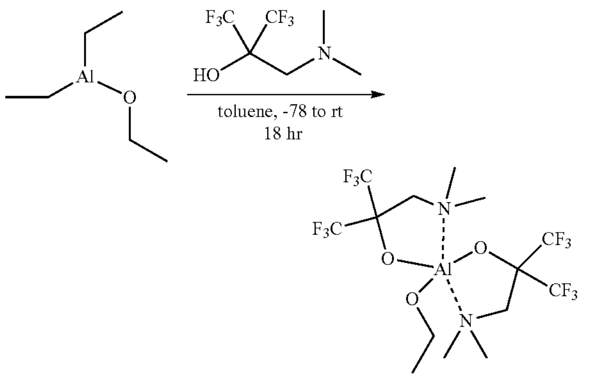

In a Schlenk flask under nitrogen diethylaluminum ethoxide (1.00 equiv, 0.0078 mol, 1.19 mL) was dissolved in toluene (100 mL) and cooled to −78° C. with stirring. 2-((Dimethylamino)methyl)-1,1,1,3,3,3-hexafluoropropan-2-ol (2.0 equiv, 0.016 mol, 3.52 grams) was slowly added to the reaction with stirring. The reaction was warmed to room temperature and stirred for 18 hours. The reaction was then taken to dryness in vacuo. A white solid was isolated and purified by vacuum sublimation @85° C. @<40 mtorr to yield 3.22 grams (79% yield). $^1$H-NMR (DMSO-d$_6$, δ (ppm)): 3.44 (2H, q, 7.0 Hz), 2.82 (4H, s), 2.31 (12H, s), 1.06 (3H, t, 7.0 Hz).

Prophetic Deposition Example 1

Thermal ALD of an InAs film using precursor tris(2-(dimethylamino)methyl-1,1,1,3,3,3-hexafluoropropan-2-ol) indium [(F-dmamp)$_3$In] and As(SiMe$_3$)$_3$ as In and As sources, respectively. Film deposition occurs using $N_2$ as a carrier gas for precursor delivery. A purge step of sufficient duration occurs after each precursor is dosed into a thermal ALD reactor. The cycle is initiated by dosing the (F-dmamp)$_3$In precursor into the reactor. As(SiMe$_3$)$_3$ is then introduced into the reactor to close the cycle. By transporting the precursors to a substrate, the precursors are adsorbed on the substrate surface. The reactive species thus diffuse at the surface to preferential sites and react in a heterogeneous phase to give rise to the formation of the InAs film with the reaction byproduct of $(CH_3)_3SiOC(CF_3)_2CH_2N(CH_3)_2$. The deposition may require no catalyst and may be carried out on a variety of substrates, such as thin Si or oxide substrates. The substrate temperature is maintained at approximately 200° C. The resulting InAs films may then undergo further processing, such as a thermal annealing step. The InAs films are characterized by various techniques such as atomic absorption (AA), FT-IR, neutron activation analysis (NAA), energy dispersive analysis by X-rays (EDAX), Rutherford back-scattering analysis (RBS), and X-ray analyses, etc., which are used to help understand the fundamental mechanism of the ALD growth.

Prophetic Deposition Example 2

Thermal ALD of an $In_2O_3$ film using precursor tris(2-(dimethylamino)methyl-1,1,1,3,3,3-hexafluoropropan-2-ol)

indium [(F-dmamp)$_3$In] and ozone, $O_3$, as In and O sources, respectively. The film deposition occurs using $N_2$ as a carrier gas for precursor delivery. A purge step of sufficient duration occurs after each precursor is dosed into a thermal ALD reactor. The cycle is initiated by dosing the (F-dmamp)$_3$In precursor into the reactor. Ozone is generated from a mixture of $O_2$ and $N_2$ via an $O_3$ generator then introduced into the reactor to close the cycle. By transporting the precursors to the substrate, the precursors are adsorbed on the substrate surface. The reactive species thus diffuse at the surface to preferential sites and react in a heterogeneous phase to give rise to the formation of the $In_2O_3$ film with the reaction byproducts being free organic ligand and/or oxidized ancillary ligand fragments. The deposition may require no catalyst and may be carried out on a variety of substrates, such as thin Si or oxide substrates. The substrate temperature is maintained at approximately 200° C. The resulting $In_2O_3$ films may then undergo further processing, such as a thermal annealing step. The $In_2O_3$ films are characterized by various techniques such as atomic absorption (AA), FT-IR, neutron activation analysis (NAA), energy dispersive analysis by X-rays (EDAX), Rutherford back-scattering analysis (RBS), and X-ray analyses, etc., which are used to help understand the fundamental mechanism of the ALD growth.

The novel molecules disclosed herein represent an opportunity to develop vapor deposition processes for Group (III) containing thin films and nanostructures. The comparative examples demonstrate that the fluorinated indium molecules show increased volatility and thermal stability relative to reported perprotio-indium complexes. Moreover, these potential precursors are compatible with dealkoxysilylation chemistry to provide an approach for realizing the deposition of III-V/III-VI thin films. This approach relies on inherently greater reactivity than previously disclosed and traditional precursors for III-V/III-VI thin films in low temperature applications.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method for forming a Group (III)-containing film on a substrate, the method comprising the steps of:

exposing the substrate to a vapor of a Group (III)-containing film-forming composition that contains a Group (III)-containing precursor and a co-reactant $As(SiMe_3)_3$; and depositing at least part of the Group (III)-containing precursor onto the substrate to form the Group (III)-containing film on the substrate through a vapor deposition process, wherein the Group (III)-containing precursor is selected from the following formulae:

(a)

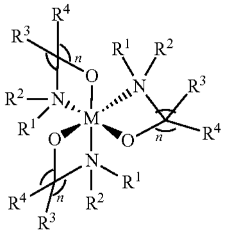

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons;

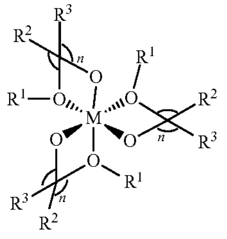

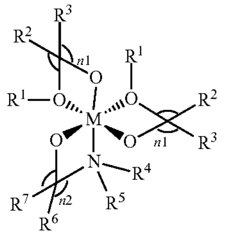

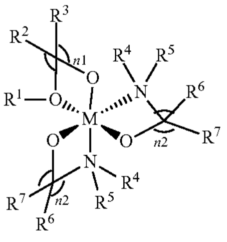

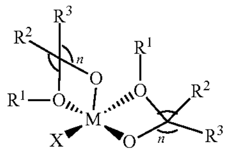

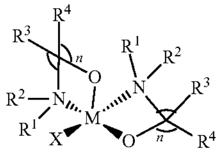

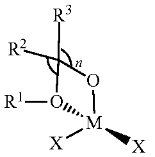

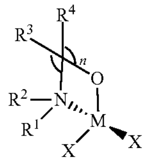

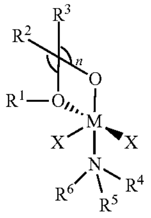

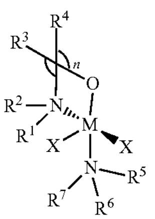

2. The method of claim 1, wherein the Group (III)-containing precursor contains at least one fluorocarbon group on at least one of ancillary ligands.

3. The method of claim 1, wherein the Group (III)-containing precursor is tris(2-(dimethylamino)methyl-1,1,1,3,3,3-hexafluoropropan-2-ol)indium, represented as (F-dmamp)$_3$In.

4. The method of claim 1, wherein the Group (III)-containing precursor is tris(2-(ethylmethylamino)methyl-1,1,1,3,3,3-hexafluoropropan-2-ol)indium.

5. The method of claim 1, wherein the Group (III)-containing film is InGaAs, $In_xO_y$ where x=0.5-1.5, y=0.5-1.5, InSnO (ITO), InGaZnO (IGZO), InN, InP, InAs, InSb, InSe, InTe, $In_2S_3$, $Ga_2O_3$, GaN, GaAs, $Al_2O_3$, AlN, AlP, AlAs, GaP, GaSb, or combination thereof.

6. The method of claim 1, wherein the vapor deposition process is a thermal ALD process.

7. A method for forming a Group (III)-containing film on a substrate, the method comprising the steps of:

forming a chemisorbed and/or physisorbed film, on the surface of the substrate, of an Group (III)-containing precursor and a co-reactant $As(SiMe_3)_3$, wherein the Group (III)-containing precursor has the formula:

(a)

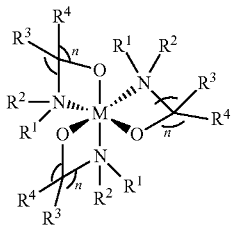

wherein M is Al, Ga, or In; $R^1$, $R^2$, $R^3$ and $R^4$ are independently selected from hydrogen, fluorine, linear, branched or cyclic alkyl groups, fluorocarbons, or aryl groups with between 1 and 12 carbons and at least one of $R^1$ though $R^4$ is a fluorine or fluorocarbon; wherein n=1-3 forming 4- to 6-membered chelates; provided that if n is greater than or equal to 2, $R^3$ and $R^4$ substituents of additional carbon units do not have to be identical and may be independently selected from hydrogen, fluorine, linear, branched or cyclic alkyl groups, fluorocarbons, or aryl groups with between 1 and 12 carbons

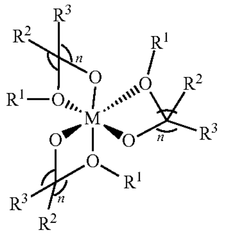

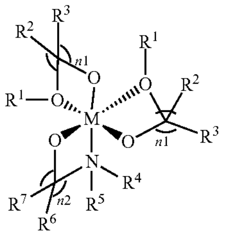

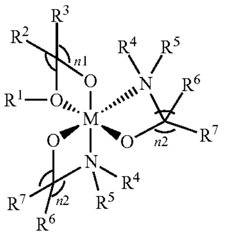
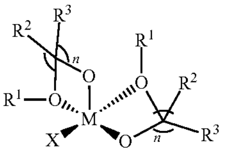
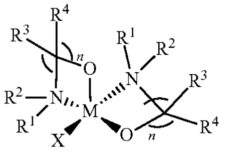
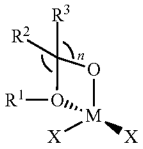
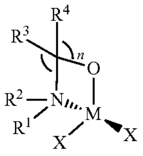
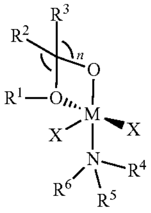
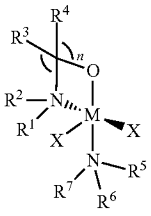
* * * * *